United States Patent [19]
May

[11] Patent Number: 6,081,216
[45] Date of Patent: Jun. 27, 2000

[54] LOW-POWER DECIMATOR FOR AN OVERSAMPLED ANALOG-TO-DIGITAL CONVERTER AND METHOD THEREFOR

[75] Inventor: Michael Robert May, Austin, Tex.

[73] Assignee: Motorola, Inc., Schaumburg, Ill.

[21] Appl. No.: 09/096,049

[22] Filed: Jun. 11, 1998

[51] Int. Cl.$^7$ .................................................... H03M 3/00
[52] U.S. Cl. ............................................ 341/143; 341/61
[58] Field of Search ................................... 341/141, 143, 341/61, 155; 708/300, 313

[56] References Cited

U.S. PATENT DOCUMENTS

| | | | |
|---|---|---|---|
| 5,079,734 | 1/1992 | Riley ...................................... | 364/724.1 |
| 5,323,157 | 6/1994 | Ledzius et al. ......................... | 341/143 |
| 5,327,133 | 7/1994 | Greene .................................... | 341/143 |
| 5,329,282 | 7/1994 | Jackson .................................. | 341/143 |
| 5,621,675 | 4/1997 | Linz et al. ............................. | 364/724.1 |
| 5,696,708 | 12/1997 | Leung .................................... | 364/724.1 |
| 5,751,615 | 5/1998 | Brown ................................... | 364/724.1 |
| 5,757,867 | 5/1998 | Caulfield ................................ | 375/350 |
| 5,787,125 | 7/1998 | Mittel ..................................... | 375/239 |
| 5,880,687 | 3/1999 | May et al. .............................. | 341/61 |
| 5,880,973 | 3/1999 | Gray et al. ............................. | 364/572 |
| 5,917,734 | 6/1999 | Gaglani ................................. | 364/724.1 |
| 5,928,313 | 7/1999 | Thompson ............................ | 708/313 |

OTHER PUBLICATIONS

Crochiere et al., Oversampling Delta Sigma Data Converters; Interpolation and decimation of Signals; pp. 438–440, 1992.

E.B. Hogenauer, An Ecomnomical Class of Digital Filters for Decimation and Interpolation; IEEE Transactions on Accoustics, Speech, and Signal Processing: vol. ASSP–29, No. 2, pp. 155–162, 1981.

*Primary Examiner*—Michael Tokar
*Assistant Examiner*—Peguy JeanPierre
*Attorney, Agent, or Firm*—Paul J. Polansky; James L. Clingan, Jr.

[57] ABSTRACT

An oversampled analog-to-digital converter (ADC) (20) includes a sigma-delta modulator (21) with two decimation filters to provide minimum power consumption. The first decimation filter (30) converts the output of the sigma-delta modulator (21) to a slower intermediate frequency and performs a first part of the decimation function. The second decimation filter (40) converts the output of the first decimation filter (30) to the output frequency and performs a second part of the decimation function. The ADC (20) saves power by allowing some of the second part of the decimation function to be performed at the slower intermediate frequency. In one form, the first decimation filter (30) includes a finite impulse response (FIR) filter (32) and a down sampler (34). By using a suitable logic circuit (56), the FIR filter (32) can be implemented with only a small amount of circuit area and most of the FIR filter (32) can be operated at the slower intermediate frequency.

26 Claims, 3 Drawing Sheets

006,081,216

LOW-POWER DECIMATOR FOR AN OVERSAMPLED ANALOG-TO-DIGITAL CONVERTER AND METHOD THEREFOR

CROSS-REFERENCE TO RELATED, COPENDING APPLICATION

Related subject matter is contained in a copending patent application entitled "Cascaded Integrator-Comb Interpolation Filter," application Ser. No. 08/806,271, filed Feb. 25, 1997, invented by Michael R. May et al., and assigned to the assignee hereof.

FIELD OF THE INVENTION

This invention relates generally to data converters, and more particularly, to oversampled analog-to-digital converters and decimators for use therein.

BACKGROUND OF THE INVENTION

There are two basic techniques for performing analog-to-digital conversion. An analog-to-digital converter (ADC) using the first technique, known as the Nyquist rate technique, generates a digital signal directly in response to an analog input signal. The Nyquist rate ADC samples the analog input signal at twice the frequency (known as the Nyquist frequency) of the highest expected frequency component of the input signal. The Nyquist rate ADC uses a series of precisely-matched components to digitize the input signal. The resolution and accuracy of the Nyquist rate ADC depend on the matching of these components. However, highly-precise components are difficult to achieve in conventional integrated circuit processing.

An ADC using the second technique, known as the sigma-delta technique, represents the analog input signal by generating a stream of digital samples whose pulse density is a measure of the voltage at the ADC input. The sigma-delta ADC includes a sigma-delta modulator and a decimator. The modulator includes a quantizer which generates a digital output signal in response to a filtered difference between the analog input signal and a feedback signal. The feedback signal is the digital output signal reconverted to an analog signal in a digital-to-analog converter (DAC). The modulator is oversampled, meaning that the sampling rate is above the Nyquist rate. The decimator resamples the output of the modulator and provides an N-bit data word at the Nyquist rate. The sigma-delta technique achieves high resolution by precise timing instead of by precisely-matched components (resistors and capacitors) which are required by the Nyquist rate ADC.

A simple sigma-delta ADC uses a first-order modulator with a single integrator performing the filter function, a one-bit quantizer, and a one-bit DAC. Since the quantizer can provide the output of the modulator at only one of two levels, its operation is necessarily linear. The first-order sigma-delta modulator has high quantization noise at the sampling frequency. The action of the filter in the modulator shapes the quantization noise to be higher at higher frequencies. Thus, the converter is referred to as a noise-shaping ADC. The decimator also includes a filter having a lowpass characteristic with a cutoff frequency at the Nyquist frequency. Since the sampling frequency is much higher than the Nyquist frequency, the filter can usually attenuate this out-of-band quantization noise sufficiently.

A second-order ADC having two filters in the modulator loop has higher out-of-band quantization noise but lower in-band noise than the first-order ADC. Thus, if the out-of-band noise can be sufficiently filtered, the second-order sigma-delta modulator has better performance. The necessary attenuation can be achieved if the decimation filter is one order greater than the order of the modulator. ADCs higher than second order are possible but typically have stability problems, and ADCs using a second-order modulator are popular.

FIG. 1 illustrates in block diagram form an analog-to-digital converter (ADC) 10 using a conventional decimation filter known in the prior art. ADC 10 includes a sigma-delta ($\Sigma$-$\Delta$) modulator 12 and a decimator 14. $\Sigma$-$\Delta$ modulator 12 has an input (not shown) for receiving an analog input signal, and an output for providing a one-bit data stream. According to the $\Sigma$-$\Delta$ technique, this one-bit data stream has a pulse density which represents the magnitude of the analog signal and is output at a frequency well above the Nyquist frequency. Decimator 14 includes a first filter 15 having a transfer function labelled "$H_1(z)$", a down sampler 16, and a second filter 17 having a transfer function labelled "$H_2(z)$". Filter 15 has an input for receiving the data stream provided by $\Sigma$-$\Delta$ modulator 12, and converts this data stream into an n-bit output signal using transfer function $H_1(z)$. Down sampler 16 converts the n-bit input signal received at the modulator frequency and converts it into an n-bit output signal at the output (Nyquist) frequency. Filter 17 has an input for receiving the n-bit output of down sampler 16, and converts it into an n-bit output signal labelled "DECIMATED DATA" using transfer function $H_2(z)$.

Decimator 14 is a conventional decimator using a cascade of integrators and combs (CIC) architecture. The transfer function of filter 15, $H_1(z)$, forms the integrator portion and is determined by the order of the modulator but for a second-order modulator is expressed as:

$$H_1(z)=(1/(1-z^{-1}))^3 \qquad [1]$$

wherein z represents the z-domain (sample) variable. The transfer function of filter 17, $H_2(z)$, forms the comb portion and is expressed as:

$$H_2(z)=(1-z^{-1})^3 \qquad [2]$$

Filter 15 is typically implemented by three successive integrators, each containing a delay register and a multi-bit adder having a width equal to the output data width. Since filter 15 precedes down sampler 16, it operates at the same clock rate as $\Sigma$-$\Delta$ modulator 12 and therefore consumes a significant amount of power. It would be desirable to reduce the amount of power consumed by decimator 14. Such a decimator is provided by the present invention, whose features and advantages will be more clearly understood from the following detailed description taken in conjunction with the accompanying drawings.

DETAILED DESCRIPTION OF A PREFERRED EMBODIMENT

Figure 2:
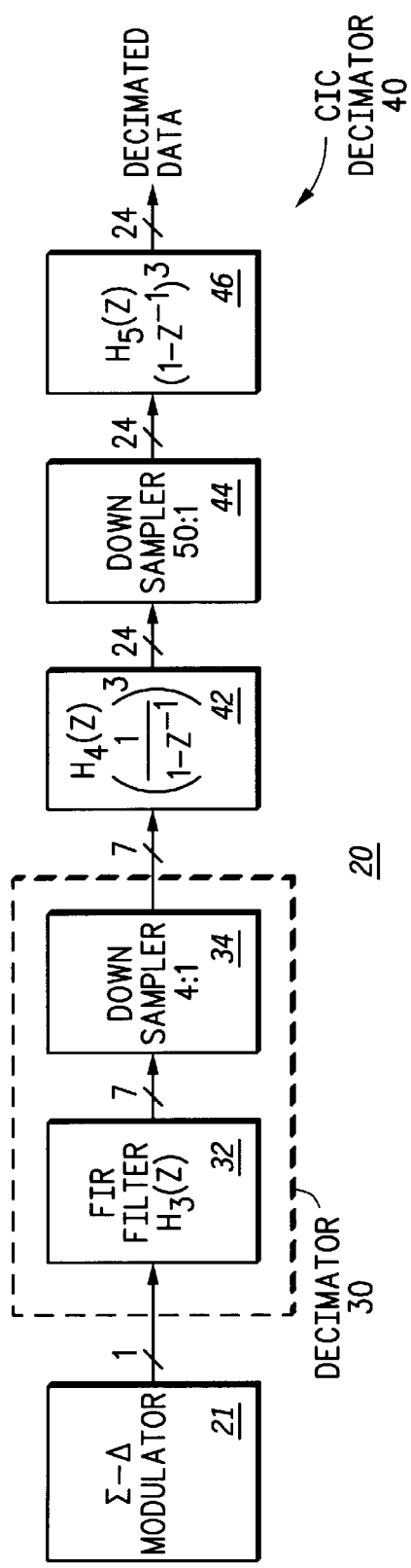
FIG. 2 illustrates in block diagram form an ADC according to the present invention.

FIG. 2 illustrates in block diagram form an analog-to-digital converter (ADC) 20 according to the present invention. ADC 20 includes generally a Σ-Δ modulator 21, a decimator 30, and a cascade of integrators and combs (CIC) decimator 40. Σ-Δ modulator 21 has an input (not shown) for receiving an analog input signal, and an output for providing a one-bit data stream. Decimator 30 has an input connected to the output of Σ-Δ modulator 21, and an output for providing a partially decimated output as a stream of 7-bit data words at an intermediate clock frequency. CIC decimator 40 has an input connected to the output of decimator 30, and an output for providing the 24-bit DECIMATED DATA at the output (Nyquist) frequency. In the illustrated embodiment, Σ-Δ modulator 21 is a second order modulator having an oversampling ratio (OSR) of 200.

Decimator 30 includes a finite impulse response (FIR) filter 32 and a down sampler 34. FIR filter 32 has an input connected to the output terminal of Σ-Δ modulator 21, and an output for providing a 7-bit data stream. Down sampler 34 has an input connected to the output of FIR filter 32, and an output for providing the partially decimated data output as a stream of 7-bit data words at an intermediate clock frequency equal to ¼ the modulator clock frequency.

CIC decimator 40 includes a first filter 42 having a transfer function labelled "$H_4(z)$", a down sampler 44, and a second filter 46 having a transfer function "$H_5(z)$". Filter 42 has an input connected to the output of down sampler 34, and converts this data stream into a 24-bit output signal provided at an output thereof using transfer function $H_4(z)$ equal to $(1/(1-z^{-1}))^3$. Down sampler 44 has an input connected to the output of filter 42, and converts the 24-bit input signal received at the intermediate frequency into a 24-bit output signal at the output (Nyquist) frequency. Filter 46 has an input connected to the output of down sampler 44, and converts it into 24-bit DECIMATED DATA using transfer function $H_5(z)$ equal to $(1-z^{-1})^3$.

Figure 1:
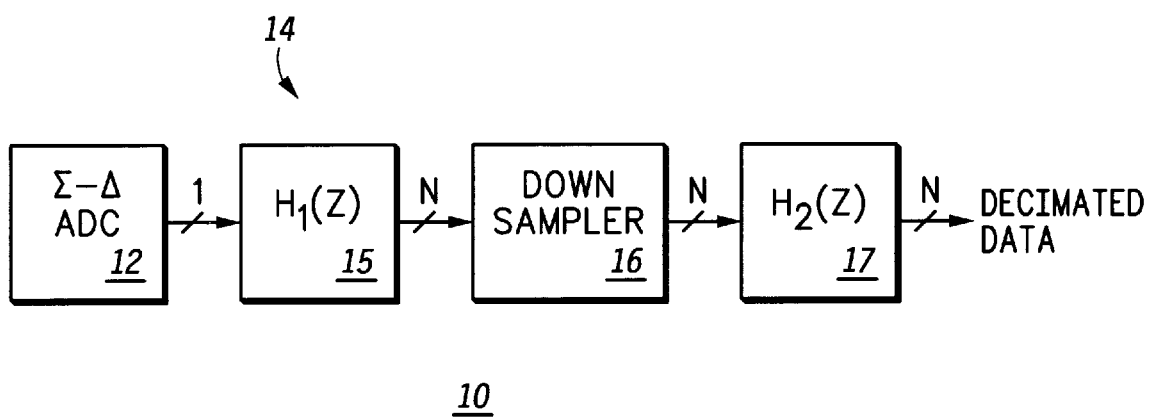
FIG. 1 illustrates in block diagram form an analog-to-digital converter (ADC) using a conventional decimation filter known in the prior art.

In operation ADC 20 provides the same 24-bit DECIMATED DATA stream as that of ADC 10 of FIG. 1, but with reduced power consumption. Decimator 30 performs a first part of the decimation function by down sampling the one-bit output of Σ-Δ modulator 21 by a 4:1 ratio. Thus decimator 30 provides the partially decimated output at a slower, intermediate clock frequency equal to one-fourth the frequency of Σ-Δ modulator 21. Decimator 40 performs an additional 50:1 decimation in order to provide the DECIMATED DATA at the lower Nyquist frequency. Decimator 40 also performs the low pass filtering to reject the noise that Σ-Δ modulator 21 shapes out of the pass band. Since filter 42 can thus be operated at the slower intermediate rate instead of at the full modulator rate, ADC 20 has significantly reduced power consumption compared to ADC 10.

FIR filter 32 is needed to reduce the high frequency noise that would otherwise be aliased into the passband by the 4:1 down sampling. In order to provide this compensation, FIR filter 32 has a transfer function expressed as:

$$H_3(z)=[(1-z^{-M})/(1-z^{-1})]^P \quad [3]$$

wherein P is the selected order of decimator 30 and M is a ratio of the clock frequency of Σ-Δ modulator 21 to the clock frequency of the partially decimated output. In the illustrated example, M=4 and P=3. Selection of $H_3(z)$ as shown will result in decimators 30 and 40 having a combined transfer function that has the CIC form. Other $H_3(z)$ transfer functions that give a desirable combined transfer function are possible as well. The important consideration is that $H_3(z)$ must reduce noise that will alias in 4:1 down sampler 34.

Down sampler 34 is conceptually placed after FIR filter 32 but the order may be reversed. As is known in the art, if an FIR filter has only feedforward terms (that is, there is no feedback in the structure of the FIR filter), the decimator can be implemented with the down sampler output provided to the FIR filter input. In this alternative embodiment, down sampler 34 contains memory elements that store data at the modulator clock rate and output data every fourth modulator clock to the input of the FIR filter.

In the illustrated embodiment, down sampler 34 also contains memory elements to store data from the output of the FIR filter every fourth modulator clock. Furthermore in the actual circuit implementation the FIR filter and down sampling functions may not be easily separated. Note that in the illustrated embodiment decimator 30 performs 4:1 down sampling, but this ratio may be altered in other embodiments. As the down sampling ratio increases, power consumption decreases until at some point a further increase is not desirable because the additional complexity and circuit area of FIR filter 32 will outweigh the power savings in filter 42. Decimator 30 has great power savings over decimator 14 of FIG. 1 if FIR filter 32 is built with only feedforward terms. Less hardware is needed and less power is consumed compared to a conventional cascade of integrators and combs implementation of decimator 30.

Figure 3:
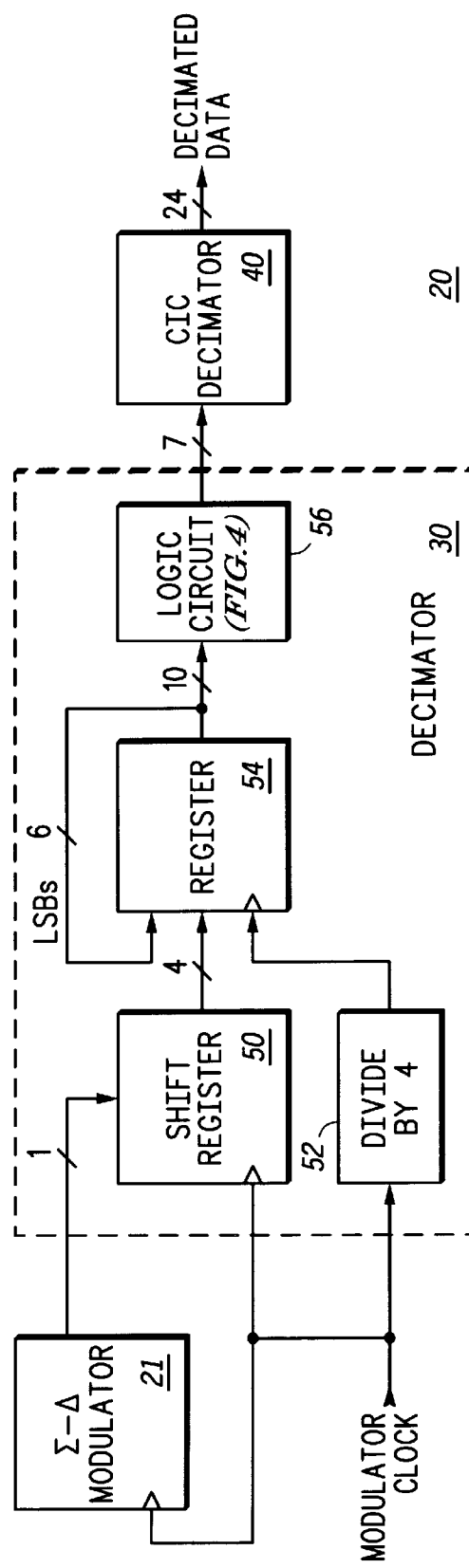
FIG. 3 illustrates in block diagram form the decimator of FIG. 3.

According to another aspect of the present invention the FIR filter can be simplified greatly, avoiding the need for a large amount of additional circuit area. FIG. 3 illustrates ADC 20 of FIG. 2 with a more detailed block diagram of decimator 30. As illustrated in FIG. 3, decimator 30 includes a shift register 50, a divide-by-4 block 52, a register 54, and a logic circuit 56. Shift register 50 has a serial input terminal connected to the output terminal of Σ-Δ modulator 21, a clock input terminal for receiving a signal labelled "MODULATOR CLOCK", and a 4-bit output terminal. Divide-by-4 block has an input terminal for receiving the MODULATOR CLOCK, and an output terminal. Register 54 has a first input terminal connected to the parallel output terminal of shift register 50, a second input terminal connected to receive the 6 least significant bits (LSBs) from a 10-bit output terminal thereof, and an clock input terminal connected to the output terminal of divide-by-4 block 52. Logic circuit 56 has an input terminal connected to the output terminal of register 54, and an output terminal connected to the input terminal of CIC decimator 40.

Decimator 30 implements a 10-tap FIR filter, but only evaluates the output of the filter every four clock cycles. Data is shifted into shift register 50 at the MODULATOR CLOCK rate, but is only transferred to register 54 once every four clock cycles. Thus only shift register 50 in decimator 30 is run at the MODULATOR CLOCK rate. In this way the output of down sampler 34 of FIG. 2 is provided to the input of FIR filter 32.

The transfer function of decimator 30, $H_3(z)$, is expressed as:

$$H_3(z)=1z^{-0}+3z^{-1}+6z^{-2}+10z^{-3}+12z^{-4}+12z^{-5}10z^{-6}+6z^{-7}3z^{-8}+1z^{-9} \quad [4]$$

A conventional FIR filter would be relatively complex, requiring a 10-tap delay line, 10 multipliers, and one 10-input adder. However $H_3(z)$ may be implemented with a relatively simple logic circuit as illustrated in FIG. 4.

Figure 4:
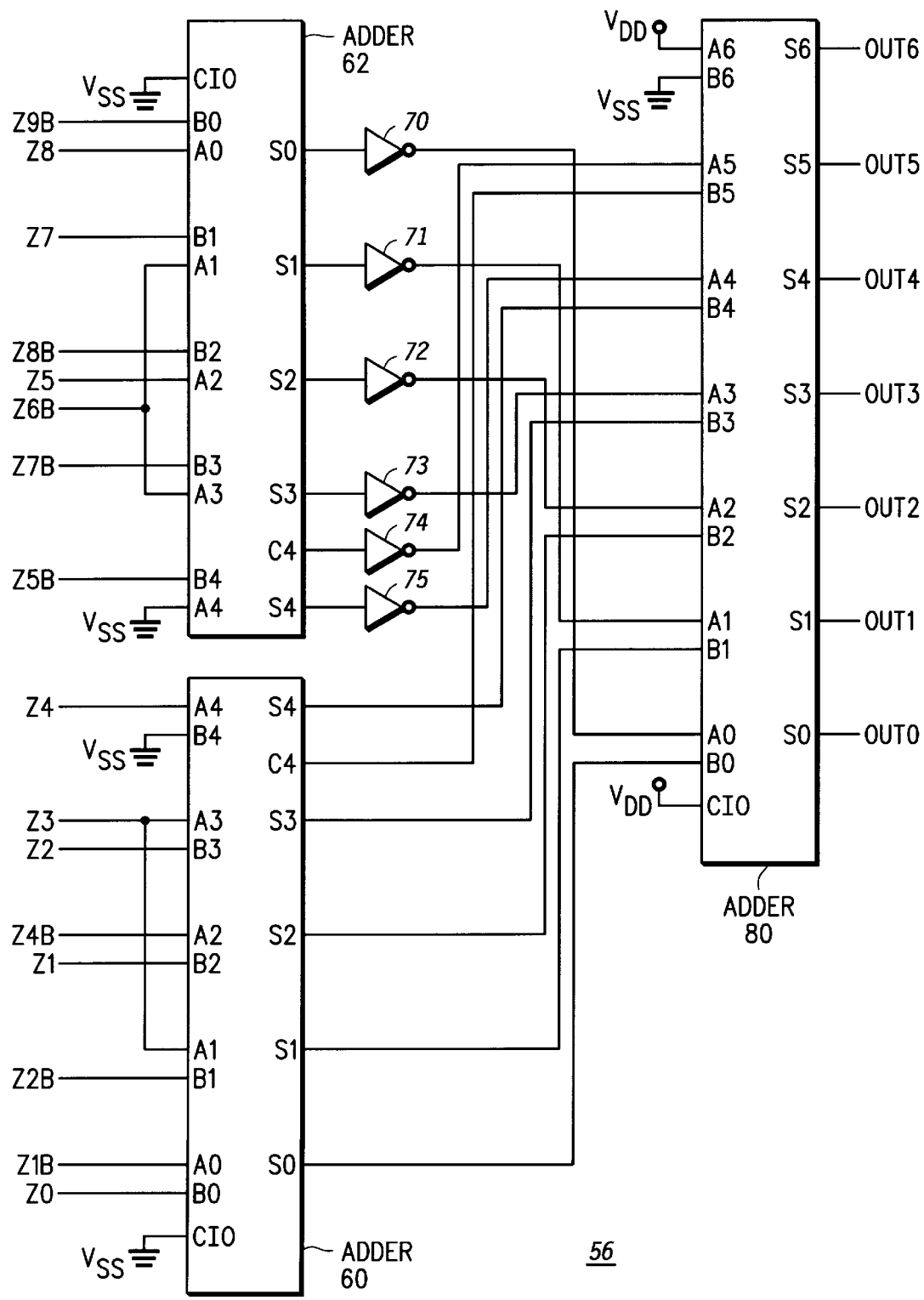
FIG. 4 illustrates in partial block form and partial logic diagram form the logic circuit of FIG. 3.

FIG. 4 illustrates in partial block form and partial logic diagram form the logic circuit 56 of FIG. 3. Logic circuit 56 includes a first adder 60, a second adder 62, inverters 70–75, and an adder 80. Adder 60 is a 5-bit full adder in which the least significant bit position is designated bit position 0, and the most significant bit position is designated bit position 4. Each bit position has an A input, a B input, a carry input designated "CI", a sum output labelled "S", and a carry output labelled "CO". Note that some inputs and outputs are not shown in FIG. 4.

In adder 60, bit position 0 has an A input for receiving signal Z1B, a B input for receiving signal Z0, a carry input is connected to a power supply voltage terminal labelled "$V_{SS}$", a sum output for providing signal S0, and a carry output. $V_{SS}$ is a more-negative power supply voltage terminal having a nominal value of 0 volts and which is representative of a logic low (binary zero) level. Note that "Z0" is the coefficient of the $z^{-0}$ term, "Z1B" is the complement of the coefficient of the $z^{-1}$ term, and so on. Bit position 1 has an A input for receiving signal Z3, a B input for receiving signal Z2B, a carry input terminal connected to the carry output terminal of bit position 0, a sum output for providing signal S1, and a carry output. Bit position 2 has an A input for receiving signal Z4B, a B input for receiving signal Z1, a carry input terminal connected to the carry output terminal of bit position 1, a sum output for providing signal S2, and a carry output. Bit position 3 has an A input for receiving signal Z3, a B input for receiving signal Z2, a carry input connected to the carry output terminal of bit position 2, a sum output for providing signal S3, and a carry output. Bit position 4 has an A input for receiving signal Z4, a B input for connected to $V_{SS}$, a carry input terminal connected to the carry output terminal of bit position 3, a sum output for providing signal S4, and a carry output terminal for providing signal C4.

In adder 62, bit position 0 has an A input for receiving signal Z8, a B input for receiving signal Z9B, a carry input is connected to $V_{SS}$, a sum output for providing signal S0, and a carry output. Bit position 1 has an A input for receiving signal Z6B, a B input for receiving signal Z7, a carry input connected to the carry output of bit position 0, a sum output for providing signal S1, and a carry output. Bit position 2 has an A input for receiving signal Z5, a B input for receiving signal Z8B, a carry input terminal connected to the carry output terminal of bit position 1, a sum output for providing signal S2, and a carry output. Bit position 3 has an A input for receiving signal Z6B, a B input for receiving signal Z7B, a carry input connected to the carry output terminal of bit position 2, and a sum output for providing signal S3, and a carry output. Bit position 4 has an A input connected to $V_{SS}$, a B input for receiving signal Z5B, a carry input terminal connected to the carry output terminal of bit position 3, a sum output for providing signal S4, and a carry output terminal for providing signal C4.

Inverter 70 has an input terminal for receiving signal S0 from adder 62, and an output terminal. Inverter 71 has an input terminal for receiving signal S1 from adder 62, and an output terminal. Inverter 72 has an input terminal for receiving signal S2 from adder 62, and an output terminal. Inverter 73 has an input terminal for receiving signal S3 from adder 62, and an output terminal. Inverter 74 has an input terminal for receiving signal C4 from adder 62, and an output terminal. Inverter 75 has an input terminal for receiving signal S4 from adder 62, and an output terminal.

In adder 80, bit position 0 has an A input connected to the output of inverter 70, a B input for receiving signal S0 from adder 60, a carry input connected to a power supply voltage terminal labelled "$V_{DD}$", a sum output for providing signal OUT0, and a carry output. $V_{DD}$ is a more-positive power supply voltage terminal having a nominal value of 3.0 volts and which is representative of a logic high (binary one) level. Bit position 1 has an A input connected to the output terminal of inverter 71, a B input for receiving signal S1 from adder 60, a carry input connected to the carry output of bit position 0, a sum output for providing signal OUT1, and a carry output. Bit position 2 has an A input connected to the output terminal of inverter 72, a B input for receiving signal S2 from adder 60, a carry input connected to the carry output of bit position 1, a sum output for providing signal OUT2, and a carry output. Bit position 3 has an A input connected to the output terminal of inverter 73, a B input for receiving signal S3 from adder 60, a carry input connected to the carry output of bit position 2, a sum output for providing signal OUT3, and a carry output. Bit position 4 has an A input connected to the output terminal of inverter 74, a B input for receiving signal S4 from adder 60, a carry input connected to the carry output of bit position 3, a sum output for providing signal OUT4, and a carry output. Bit position 5 has an A input connected to the output terminal of inverter 75, a B input for receiving signal S5 from adder 60, a carry input connected to the carry output of bit position 4, a sum output for providing signal OUT5, and a carry output. Bit position 6 has an A input connected to $V_{DD}$, a B input connected to $V_{SS}$, a carry input connected to the carry output of bit position 5, and a sum output for providing signal OUT6.

Logic circuit 56 decomposes each FIR filter coefficient into a sum of powers of two: three is equal to two ($2^1$) plus one ($2^0$), six is equal to four ($2^2$) plus two ($2^1$), and so on. Since FIR filter 32 applies $H_3(z)$ to a one-bit data input, the product of the one-bit data input and a corresponding coefficient can be formed by providing the one-bit data input to corresponding bit positions of an adder. For example, ten equals eight ($2^3$) plus two ($2^2$), so the $z^{-3}$ bit value is provided to both the A3 and the A1 inputs of adder 60. In this method, when the $z^{-3}$ bit value changes state, the output of adder 62 and the output of FIR filter 32 change by an amount equal to the coefficient of the $z^{-3}$ bit value, i.e. 10.

In order to maximize the efficiency of adder 60, however, an additional technique is utilized. Since any steady-state ("DC") offset in the output signal of adder 60 can cancelled with a complement DC offset in adder 62, equivalent sums of powers of two can be used to represent the coefficients. For example, three is equal to two ($2^1$) plus one ($2^0$), but it is also equal to four ($2^2$) minus one ($2^0$). Thus the $z^{-1}$ term can be formed either by inputting $z^{-1}$ to both the $2^1$ and $2^0$ bit positions of adder 60, or by inputting $z^{-1}$ to the $2^2$ bit position and the inverse of $z^{-1}$ to the $2^0$ bit position. By intelligently allocating the FIR filter taps to the available adder bit positions, one only needs a 5-bit adder. It should be apparent that as the down sampling rate increases, the complexity of $H_3(z)$ and hence of logic circuit 56 will increase and eventually offset the power savings.

While the invention has been described in the context of a preferred embodiment, it will be apparent to those skilled in the art that the present invention may be modified in numerous ways and may assume many embodiments other than that specifically set out and described above. For example, the order of the FIR filter and the down sampler in the first decimator may be reversed. Furthermore, the down sampling ratio of the down sampler in the first decimator may change for optimal power reduction for the given application. The FIR filter could be used outside the field of ADCs or decimators. The FIR filter could also receive multiple inputs. Also logic circuit 56 could be implemented using other circuit elements besides adders. Accordingly, it is intended by the appended claims to cover all modifications of the invention which fall within the true scope of the invention.

I claim:

1. An analog to digital converter, comprising:

a sigma delta modulator having an output;

a finite impulse response filter;

a down sampler, said down sampler and finite impulse response filter coupled serially together and coupled to the output of the sigma delta modulator and providing a partially decimated output; and a cascade of integrators and combs (CIC) decimator having an input for receiving the partially decimated output and providing a fully decimated signal.

2. The analog to digital converter of claim 1 wherein the output of the sigma delta modulator is a single bit output at a first frequency and the partially decimated output is provided at a second frequency which is lower than the first frequency.

3. The analog to digital converter of claim 2 wherein the partially decimated output has a first plurality of bits.

4. The analog to digital converter of claim 1 wherein:

the finite impulse response filter has an input coupled to the output of the sigma delta modulator and has an output; and the down sampler has an input coupled to the output of the finite impulse response filter and has an output for providing the partially decimated output.

5. The analog to digital converter of claim 1 wherein:

the down sampler has an input coupled to the output of the sigma delta modulator and has an output; and the finite impulse response filter has an input coupled to the output of the down sampler and has an output for providing the partially decimated output.

6. The analog to digital converter of claim 1, wherein the finite impulse response filter is comprised of only feedforward paths.

7. The analog to digital converter of claim 1 wherein said CIC decimator comprises:

a first filter portion having an input for receiving the partially decimated output and an output;

a second down sampler having an input coupled to the output of the first filter portion and an output; and a second filter portion having an input coupled to the output of the second down sampler, and an output for providing said fully decimated signal.

8. A circuit for filtering an input signal comprised of serial data according to a predetermined impulse response equation having a plurality of coefficients which correspond to a plurality of delayed signals derived from the serial data, comprising:

a plurality of delay circuits serially coupled to the serial data which generate the plurality of delayed signals; and an adder having multiple inputs for receiving the plurality of delayed signals and having an output which changes when one of the plurality of delayed signals changes state, such change in the output of the adder being by an amount equal to a coefficient which corresponds to the one of the plurality of delayed signals which changed state.

9. The circuit of claim 8, further wherein at least one delayed signal is coupled to more than one input of the adder.

10. The circuit of claim 9 wherein the serial data is sigma delta modulated data and the predetermined impulse response equation attenuates the high frequency quantization noise.

11. A circuit for performing a predetermined transfer function on an output of a sigma delta modulator operating at a first frequency to provide a digital signal which is representative of an analog signal, comprising:

a first decimation filter coupled to the sigma delta modulator, wherein said first decimation filter operates at a second frequency that is slower than the first frequency and performs a first portion of the predetermined transfer function; and a second decimation filter coupled to the first decimation filter, wherein said second decimation filter performs a second portion of the predetermined transfer function, said second decimation filter characterized as being a cascade of integrators and combs (CIC) decimation filter.

12. The circuit of claim 11 wherein the first decimation filter comprises a finite impulse response filter and a down sampler.

13. The circuit of claim 12 wherein the down sampler is directly connected to the output of the sigma delta modulator.

14. The circuit of claim 12 wherein the finite impulse response filter implements a transfer function characterized by a plurality of coefficients and comprises:

a plurality of in-series delay circuits coupled to the sigma delta modulator which generate a plurality of delayed signals, each delayed signal of the plurality of delayed signals having a corresponding one of the plurality of coefficients; and an adder having multiple inputs for receiving the plurality of delayed signals and having an output which changes when one of the plurality of delayed signals changes state, such change in the output of the adder being by an amount equal to a coefficient of the plurality of coefficients which corresponds to the one of the plurality of delayed signals which changed state.

15. The circuit of claim 11, wherein the first decimation filter has a Z-domain transfer function expressed as $[(1-Z^{-M})/(1-Z^{-1})]^P$ wherein P is a selected order of the first decimation filter and M is a ratio of the first frequency to the second frequency.

16. A method for filtering an input signal comprised of serial data according to a predetermined impulse response equation having a plurality of coefficients which correspond to a plurality of delayed signals derived from the serial data, comprising:

delaying the serial data with a plurality of sequential delays to generate the plurality of delayed signals; and applying each of the plurality of delayed signals to at least one input of an adder so that an output of the adder changes by an amount equal to one of the plurality of coefficients when a corresponding one of the plurality of delayed signals changes state.

17. The method of claim 16 wherein the serial data is sigma delta modulated data.

18. The method of claim 17 wherein the predetermined impulse response equation is a low pass transfer function.

19. The method of claim 16 wherein the output of the adder has a first magnitude of quantization noise and the serial data has a second magnitude of quantization noise, said first magnitude being less than said second magnitude.

20. The method of claim 16, wherein the adder has a plurality of inputs and at least one of the plurality of delayed signals is received by more than one input of the plurality of inputs of the adder.

21. A method for performing a sample rate reduction on data from an output of a sigma delta modulator operating in response to a modulator clock operating at a first frequency to provide a digital signal which is representative of an analog signal, comprising:

dividing the modulator clock by a first amount to provide a first decimated clock;

storing a second amount of the data from the output of sigma delta modulator;

filtering the second amount of the data through a finite impulse response filter operating in response to the first decimated clock to provide a first decimated output; and decimating the first decimated output in a cascade of integrators and combs (CIC) decimation filter to provide the digital signal.

22. The method of claim 21 wherein the first amount is an integer which is a power of 2.

23. The method of claim 21 wherein the finite impulse response filter has a impulse response length and the second amount is an integer equal to the impulse response length of the finite impulse response filter.

24. The method of claim 21 wherein:

the finite impulse response filter has a transfer function characterized by a plurality of coefficients;

the step of storing a second amount of the data provides a plurality of delayed signals, each of said plurality of delayed signals corresponding to one of the plurality of coefficients; and the method further includes the step of applying each of the plurality of delayed signals to at least one input of an adder so that an output of the adder changes by an amount equal to one of the plurality of coefficients when a corresponding one of the plurality of delayed signals changes state, wherein said output of the adder provides the first decimated output.

25. A method for decimating an input signal comprised of serial data according to a predetermined impulse response equation having a plurality of coefficients which correspond to a plurality of delayed signals derived from the serial data which is provided at a first rate, comprising:

delaying the serial data with a plurality of sequential delays to generate the plurality of delayed signals;

applying each of the plurality of delayed signals to at least one input of an adder so that an output of the adder changes by an amount equal to one of the plurality of coefficients when a corresponding one of the plurality of delayed signals changes state; and operating the adder at a second rate which is lower than the first rate.

26. In an analog to digital converter comprising a sigma delta modulator having an input for receiving an analog signal and providing an output at a first frequency, and a cascade of integrators and combs (CIC) decimator having an input and an output for providing an output of the analog to digital converter at a second frequency sufficient to represent the expected frequency content of the analog signal, the improvement wherein the analog to digital converter further comprises:

a finite impulse response filter; and a down sampler, said down sampler and finite impulse response filter coupled serially together and coupled to the output of the sigma delta modulator and providing a partially decimated output at an intermediate frequency that is between the first and second frequencies to the input of the CIC decimator.

* * * * *